(12) United States Patent
Kinsey et al.

(10) Patent No.: US 8,237,049 B2
(45) Date of Patent: Aug. 7, 2012

(54) PHOTOVOLTAIC CELLS WITH SELECTIVELY PATTERNED TRANSPARENT CONDUCTIVE COATINGS, AND ASSOCIATED METHODS

(75) Inventors: Geoffrey S. Kinsey, Pasadena, CA (US); Shoghig Mesropian, Tarzana, CA (US)

(73) Assignee: The Boeing Company, Chicago, IL (US)

( * ) Notice: Subject to any disclaimer, the term of this patent is extended or adjusted under 35 U.S.C. 154(b) by 802 days.

(21) Appl. No.: 11/846,932

(22) Filed: Aug. 29, 2007

(65) Prior Publication Data

US 2009/0056799 A1    Mar. 5, 2009

(51) Int. Cl.
*H01L 31/00* (2006.01)
*H01L 21/00* (2006.01)
*H01L 21/44* (2006.01)

(52) U.S. Cl. ........ 136/256; 136/252; 136/259; 136/261; 438/57; 438/98; 438/609

(58) Field of Classification Search .................. 136/246, 136/256, 259, 252, 261; 438/57, 98, 609
See application file for complete search history.

(56) References Cited

U.S. PATENT DOCUMENTS

| | | | | |
|---|---|---|---|---|
| 4,977,013 | A | * | 12/1990 | Ritchie et al. .................. 428/212 |
| 5,374,317 | A | * | 12/1994 | Lamb et al. .................... 136/246 |
| 5,909,051 | A | * | 6/1999 | Stockman et al. ............. 257/610 |
| 2005/0083307 | A1 | * | 4/2005 | Aufderheide et al. ........ 345/173 |
| 2005/0150543 | A1 | * | 7/2005 | Nakashima et al. .......... 136/256 |

OTHER PUBLICATIONS

Aiken et al. "Alternative contact designs for thin film epitaxial silicon solar cells". Prog. Photovolt.: Res. Appl. 7, 275-285 (1999).*

* cited by examiner

*Primary Examiner* — Basia Ridley
*Assistant Examiner* — Lindsey Bernier
(74) *Attorney, Agent, or Firm* — Yee & Associates, P.C.

(57) ABSTRACT

A photovoltaic cell comprising a selectively patterned, transparent, conductive coating (TCC) on a sunward surface. The selectively patterned TCC is contiguous with at least some highly conductive gridlines on the sunward surface. A portion of the sunward surface of the semiconductor wafer is not covered by either the gridlines or the TCC. Also disclosed are methods of manufacturing a photovoltaic cell comprising a selectively patterned, transparent, conductive coating (TCC) on a sunward surface. The methods include the step of modeling the optical and electrical properties of the semiconductor, the gridlines, and the TCC to determine a pattern for the TCC that results in a low relative power loss for the photovoltaic cell.

18 Claims, 3 Drawing Sheets

PHOTOVOLTAIC CELLS WITH SELECTIVELY PATTERNED TRANSPARENT CONDUCTIVE COATINGS, AND ASSOCIATED METHODS

BACKGROUND

1. Technical Field

The present disclosure relates to photovoltaics, and more specifically to photovoltaics with transparent conductive coatings.

2. Description of Related Art

Concentrating photovoltaics (CPV) have great potential to make solar energy cost competitive with other energy sources. In CPV, sunlight is collected from a large area and concentrated on a relatively small solar cell area through the use of some combination of reflective and/or refractive optics. The solar cell comprises semiconductors that convert sunlight into electricity. Concentration of the sunlight increases the efficiency of the solar cells and reduces the volume of (expensive) solar cell material required to produce a given power output. In such a system, very high efficiency (and high cost) multijunction cells may be used with a net improvement in overall system cost per unit energy.

The high current densities generated in the semiconductor under concentration can, however, result in significant resistive power losses that can offset the gains in efficiency brought by concentration. With multijunction cells, thick, closely spaced gridlines of silver or another highly conductive material may be provided on the sunward surface of the cell to collect the current. For example, FIG. 1 illustrates an example of a semiconductor wafer 10 having a network of gridlines 12 on the sunward surface 14 thereof. Sunlight 16 reaches the semiconductor 10 in the regions not obscured by the gridlines. Within the semiconductor material 10, electrical current is generated and moves toward the gridlines for collection, as indicated by the current flow lines 18 in FIG. 1. Because current flows toward the gridlines 12, the current density in the semiconductor 10 increases with proximity to the gridlines 12. The gridlines 12 are closely spaced to minimize the resistive power loss ($P_{loss} \sim I^2 R$) resulting from the high current density under concentrated sunlight conditions.

The closely-spaced gridlines 12 reduce the resistive power loss, but, since the gridlines 12 are optically opaque, they prevent light from reaching a portion of the semiconductor surface 14. Typically the gridlines 12 cover 5-10% of the total surface area. The most advantageous spacing between gridlines is therefore influenced by the trade-off between resistive power loss and the obscuration (shadowing) loss. An increase in cell efficiency can be achieved if the metal gridline spacing can be increased.

At the high concentrations (>500×) used for CPV systems, obscuration by the metal gridlines limits solar cell performance. The recent world records of over 40% multifunction efficiencies were actually achieved at significantly lower concentrations (<250×). Efficiency falls off at higher concentrations due to obscuration. Therefore, reductions in obscuration can boost efficiency at higher concentrations.

Transparent conductive coatings (TCCs) are sometimes applied to the sunward surfaces of solar cells. TCCs provide electrical conduction (reduced resistance) while allowing light to pass through them to the underlying semiconductor. TCCs are applied in a blanket fashion to the entire sunward surface of each solar cell. Examples of TCCs in use today include transparent conductive oxides (TCOs), such as indium-tin oxide (ITO) or zinc oxide. Optical transmission of TCCs is typically 80-95%.

Many TCCs available today are limited in both their conduction and optical transmission. As such, they are mainly used in a number of lower-cost, lower-efficiency solar cell technologies. TCCs are currently a net benefit only for cells that are both more resistive and less sensitive to optical transmission losses than the high-efficiency cells used in CPV. When used in a high-efficiency multijunction cell, a blanket coat of TCC decreases the resistive power losses, but introduces optical transmission losses that more than offset the gains.

SUMMARY

The embodiments of the present photovoltaic cells and associated methods have several features, no single one of which is solely responsible for their desirable attributes. Without limiting the scope of the present embodiments as expressed by the claims that follow, their more prominent features will now be discussed briefly. After considering this discussion, and particularly after reading the section entitled "Detailed Description", one will understand how the features of the present embodiments provide advantages, which include a net increase in absolute cell efficiency.

One aspect of the present photovoltaic cells and associated methods includes the realization that TCCs are advantageously conductive, but disadvantageously partially opaque. Accordingly, it would be advantageous to harness the conductivity of the TCC while limiting the disadvantageous effects created by the partial opacity of the TCC.

One embodiment of the present photovoltaic cells and associated methods comprises a photovoltaic cell configured for use in a concentrating photovoltaic (CPV) system to absorb radiant solar energy and generate electrical power. The photovoltaic cell comprises a semiconductor wafer having a sunward surface. A sunward surface of the wafer includes a network of gridlines and a selectively patterned, transparent, conductive coating (TCC). The selectively patterned TCC is contiguous with at least some of the gridlines.

Another embodiment of the present photovoltaic cells and associated methods comprises a photovoltaic cell configured for use in a concentrating photovoltaic (CPV) system to absorb radiant solar energy and generate electrical power. The photovoltaic cell comprises a semiconductor wafer having a sunward surface. A sunward surface of the wafer includes a network of gridlines and a selectively patterned, transparent conductive coating (TCC). A portion of the sunward surface of the semiconductor wafer is not covered by either the gridlines or the TCC.

Another embodiment of the present photovoltaic cells and associated methods comprises a method of manufacturing a photovoltaic cell configured for use in a concentrating photovoltaic (CPV) system. The method comprises the steps of: applying a network of gridlines on a sunward surface of a semiconductor wafer; applying a selectively patterned, transparent, conductive coating (TCC) on the sunward surface; and modeling the optical and electrical properties of the semiconductor, the gridlines, and the TCC to determine a pattern for the TCC that results in a low relative power loss for the photovoltaic cell. A portion of the sunward surface of the semiconductor wafer is not covered by either the gridlines or the TCC.

The features, functions, and advantages of the present embodiments can be achieved independently in various embodiments, or may be combined in yet other embodiments.

BRIEF DESCRIPTION OF THE DRAWINGS

The embodiments of the present photovoltaic cells and associated methods will now be discussed in detail with an emphasis on highlighting the advantageous features. These embodiments depict the novel and non-obvious photovoltaic cells and associated methods shown in the accompanying drawings, which are for illustrative purposes only. These drawings include the following figures, in which like numerals indicate like parts.

DETAILED DESCRIPTION

Figure 2:
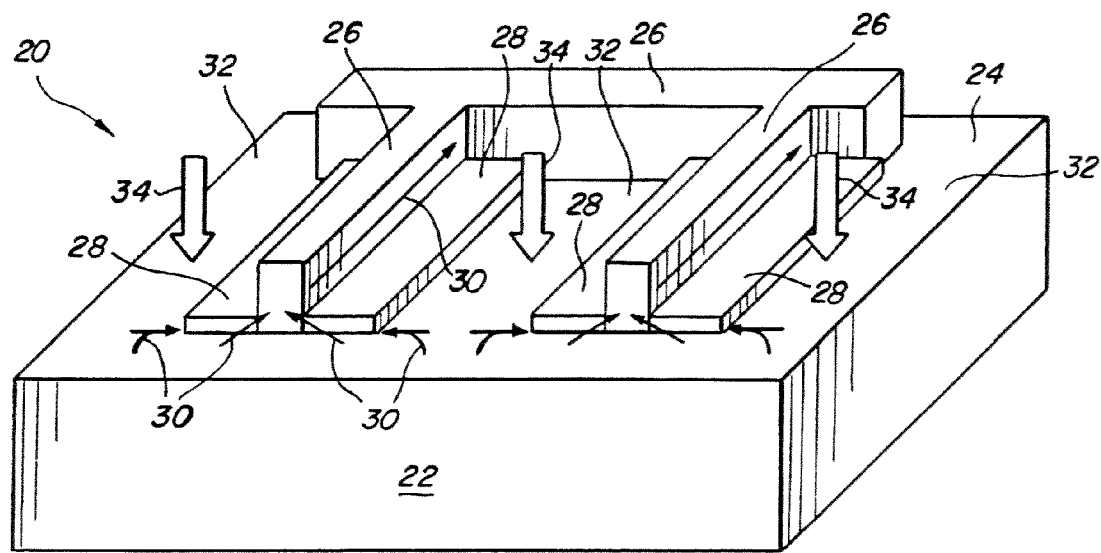
FIG. 2 is a top perspective view of a section of one embodiment of the present photovoltaic cells including a network of conductive gridlines and a selectively patterned transparent, conductive coating.

FIG. 2 illustrates a representative portion of one embodiment of the present photovoltaic cells 20. The photovoltaic cell 20 comprises a semiconductor wafer 22. Non-limiting examples of materials that may be used in the semiconductor wafer 22 include AlGaInP, AlInP, GaInP, AlGaAs, GaInAs, GaAs, and Ge. In some embodiments a sunward surface 24 of the semiconductor wafer 22 may include an anti-reflective coating (not shown). Accordingly, when used to refer to the semiconductor wafer 22 the term "surface" is used broadly herein to include both bare semiconductor material and any coating on the semiconductor wafer 22.

With further reference to FIG. 2, the sunward surface 24 includes a network of gridlines 26. The gridlines 26 may comprise a highly conductive material or materials, such as metals. In one embodiment the gridlines 26 comprise silver combined with thin layers of other metals used to form a good ohmic contact with the semiconductor 24. The gridlines 26 may be patterned using standard photolithography and deposited on the semiconductor 24 via standard processes such as evaporation or sputtering. Those of ordinary skill in the art will appreciate that alternative materials and processes may be used for the gridlines 26.

The photovoltaic cell 20 further comprises a selectively patterned, transparent, conductive coating (TCC) 28 on the sunward surface 24. In the illustrated embodiment, the selectively patterned TCC 28 extends from the gridlines 26. The TCC 28 is contiguous with the gridlines 26 and effectively forms extensions thereof. In a cross-section view taken through a single gridline 26 (FIG. 2), the cross-section resembles an inverted letter T, with the gridline 26 forming the stem of the T and the TCC 28 extending outward to either side of the gridline 26. As those of ordinary skill in the art will appreciate, the figures of the present application are may not be drawn to scale, and in alternative embodiments the relative dimensions of the gridlines 26 and the TCC 28 may vary from those shown in FIG. 2. Further, in some embodiments the TCC 28 may extend from every gridline 26, while in other embodiments the TCC 28 may extend from only select gridlines 26.

In certain embodiments the TCC 28 is highly optically transmissive, but also electrically conductive. For example, the TCC 28 may be a transparent conductive oxide (TCO), such as indium-tin oxide (ITO) or zinc oxide. Alternatively, the TCC 28 may be formed with very thin, semi-transparent layers of metals such as silver. The TCC 28 may be patterned using standard photolithography and deposited via standard processes such as evaporation or sputtering, combined with liftoff, dry, or wet etch processes. The TCC 28 may also be deposited in combination with an anti-reflective coating (not shown). In such an embodiment the TCC 28 and the anti-reflective coating may be merged or integrated into a single layer, or they may occupy separate layers.

Figure 1:
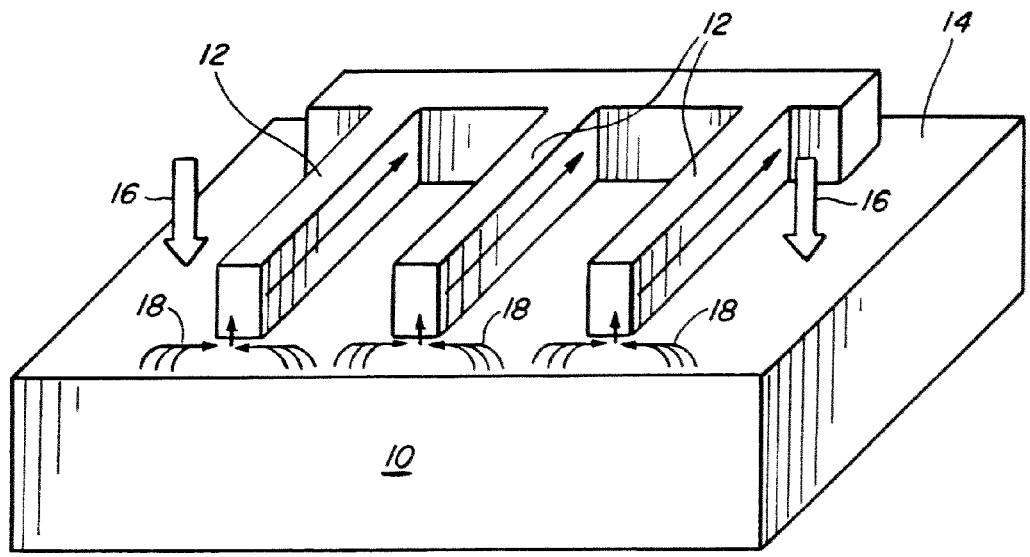
FIG. 1 is a top perspective view of a section of a prior art photovoltaic cell including a network of conductive gridlines.

As FIG. 2 illustrates, the present photovoltaic cell 20 includes a new contact scheme that combines gridlines 26 and TCCs 28. The TCC 28 is selectively patterned. In the illustrated embodiment, the selective patterning comprises the TCC 28 being placed only in the vicinity of the gridlines 26. As discussed above with reference to FIG. 1 on the sunward surface of a photovoltaic cell having gridlines, current flows toward the gridlines. Thus, current density is highest in the vicinity of the gridlines, as illustrated by the current lines 18 shown in FIG. 1. The resistive power losses generated by the high current density are analogous to a traffic jam. The gridlines are a freeway, and the electrons are cars attempting to enter the freeway. Because the electrons can only enter at areas close to the gridlines, the electrons jam up near the gridlines and create resistance for other electrons that are also trying to get to the gridlines. Placing the TCC 28 of the present photovoltaic cells 20 in the areas where current density is highest increases the area over which electrons may "enter the freeway", as shown by the current lines 30 in FIG. 2. Increasing the available entry points for electrons decreases the resistive power loss in the cell 20 and boosts cell efficiency.

As FIG. 2 illustrates, in the present embodiments the TCC 28 is not applied to the semiconductor 22 in a blanket fashion. Rather, portions 32 of the semiconductor surface 24 distant from the gridlines 26 are left exposed. The exposed portions 32 do not suffer the detrimental transmission losses that the coated portions do. Thus, the present embodiments advantageously harness the conductivity of the TCC 28 while limiting the disadvantageous effects created by the partial opacity of the TCC 28. While the TCC 28 generates some loss in optical transmission of sunlight 34, it obtains a net increase in efficiency. The addition of the patterned TCC 28 also allows the gridlines 26 to be spaced more widely, which reduces obscuration losses from the gridlines 26 and even further boosts overall cell efficiency. Experimental results have shown that by introducing the patterned TCC 28, a greater than 0.5% absolute efficiency increase can be achieved at 1000× concentration under current limits for TCC's and metal gridlines. This increase is comparable to at least one year of typical multifunction solar cell development.

In certain embodiments, modeling of the optical and electrical properties of the semiconductor 22, the metal gridlines 26, and the TCC 28 of the present photovoltaic cell 20 may be used to determine a pattern of the gridlines 26 and the TCC 28 that results in a low relative power loss for the photovoltaic cell 20. For example, a spacing of the gridlines 26 and a thickness and a width of each portion of TCC 28 may be determined through modeling. Non-limiting examples of inputs for the model include illumination intensity, expected current density at 1-sun intensity, sheet resistance of the semiconductor 22, contact resistance of the gridline/semiconductor interface, resistivity of the gridlines 26, thickness of the gridlines 26, width of the gridlines 26, length of the gridlines 26, sheet resistance of the TCC 28 and transmission of the TCC 28. These inputs may be used to calculate the following non-limiting loss factors: $I^2R$ power loss from series resistance in the semiconductor 22 and the patterned TCC 28 as a function of the pitch between the gridlines 26; $I^2R$ power loss from contact resistance in the gridline/semiconductor interface as a function of the pitch between the gridlines 26; $I^2R$ power loss from series resistance in the gridlines 26 as a function of the pitch between the gridlines 26, obscuration (shadowing) of the gridlines 26 and obscuration of the patterned TCC 28 (due to its limited transmission capability). The sum of these loss mechanisms produces a total power loss that depends on the pitch between the gridlines 26 with the patterned TCC 28. Varying the pitch and the width of the TCC 28 indicates an optimum pitch and TCC 28 width for the lowest power loss.

Figure 3:
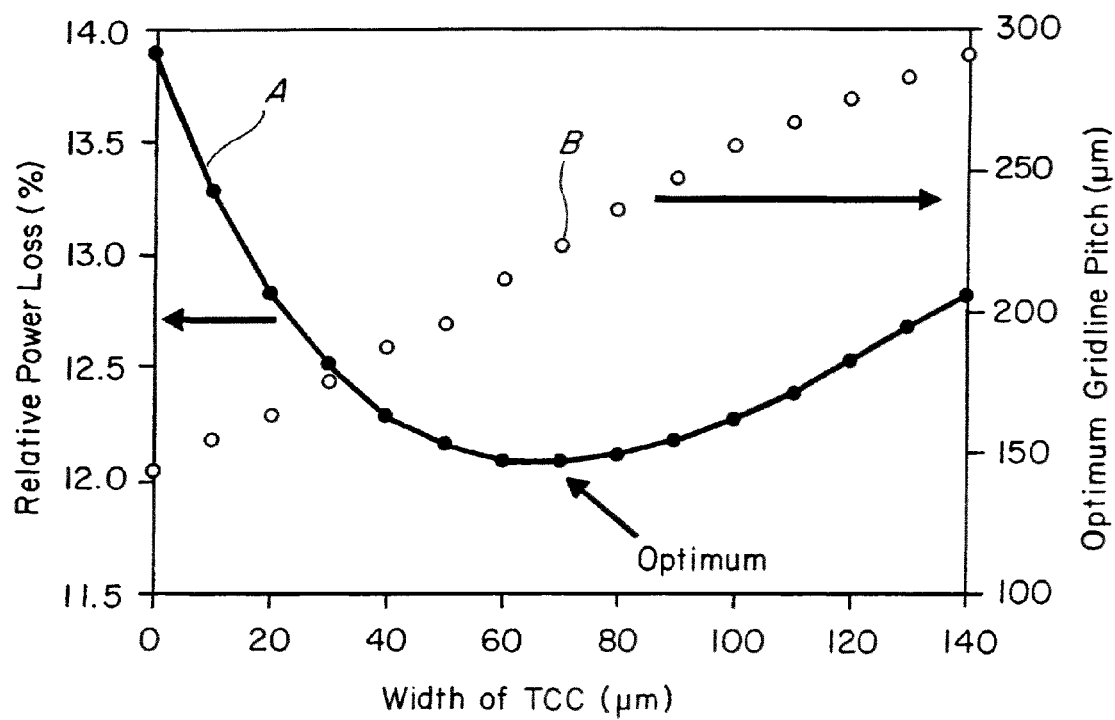
FIG. 3 is a graph illustrating relationships between a) a width of the TCC and relative power loss, and b) a width of the TCC and gridline spacing.

FIG. 3 illustrates the relationships between a) a width of the TCC 28 and relative power loss (curve "A"), and b) a width of the TCC 28 and gridline spacing (curve "B"). With reference to FIG. 3, without a TCC 28 (width=0) the relative resistive power loss in the cell is almost 14%. Increasing the width of the TCC 28 reduces the resistive power loss and allows the gridline spacing to increase. However, past a certain point any further increase in the coverage of TCC 28 is detrimental due to the optical transmission losses of the TCC 28. The optimum design for the illustrated example is a TCC 28 having a width of approximately 70-μm and a grid spacing of approximately 220 μm. This configuration achieves a decrease in relative power loss of almost 2%, which translates to a 0.8% absolute efficiency increase for a 40% cell.

Figure 4:
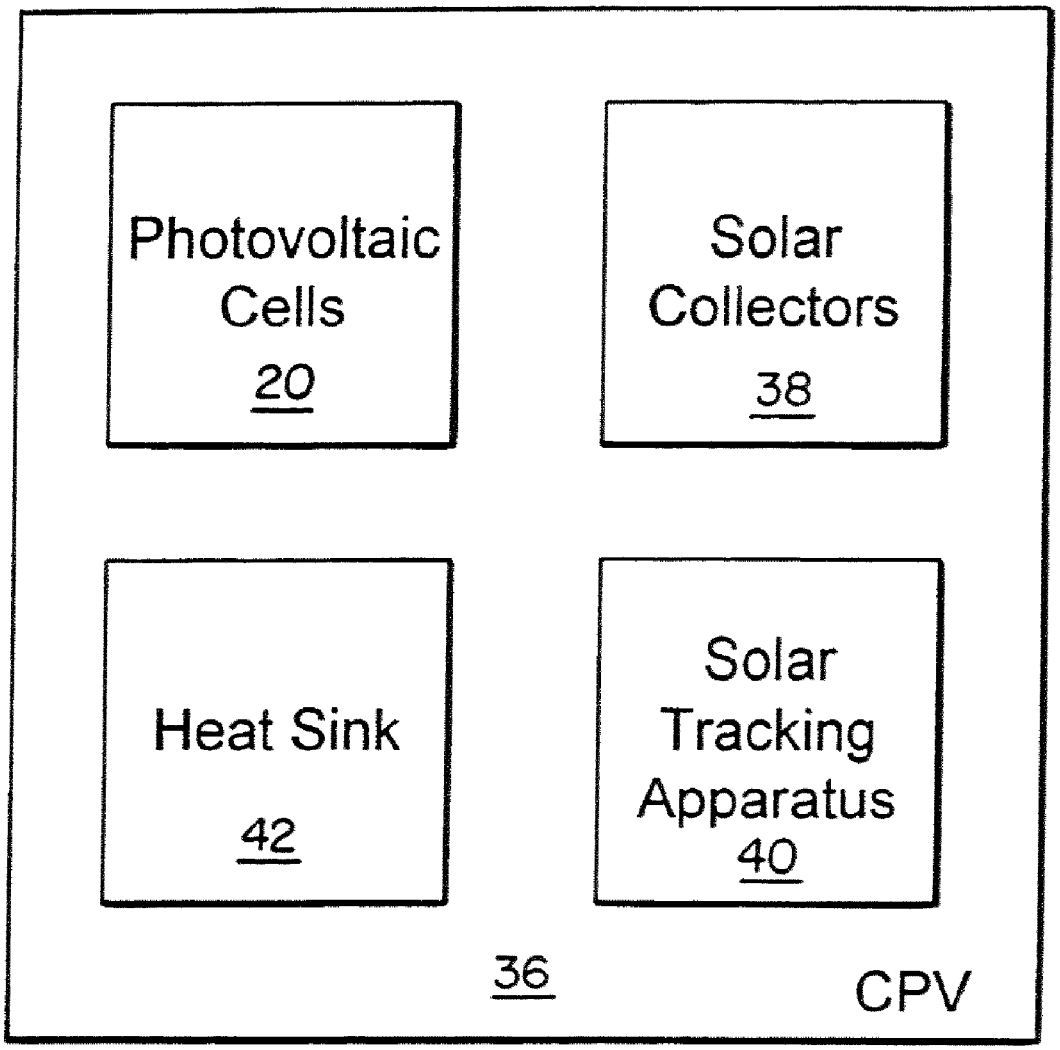
FIG. 4 is a schematic block diagram of a CPV system including the present photovoltaic cells.

The present photovoltaic cells 20 may be incorporated in a CPV system 36, as shown in the schematic block diagram of FIG. 4. The illustrated CPV system 36 includes solar collectors 38 configured to capture the sun's radiant energy. The solar collectors 38 may include mirrors and/or lens optics configured to concentrate sunlight and focus the concentrated light on the photovoltaic cells 20. The illustrated CPV system 36 further includes solar tracking apparatus 40 configured to enable the CPV system 36 to follow the sun's path across the sky so that the solar collectors 38 are always pointing directly at the sun. The illustrated CPV system 36 further includes a heat sink 42 configured to dissipate heat from the photovoltaic cells 20. The concentrated sunlight focused on the photovoltaic cells 20 tends to warm the cells, which can reduce their efficiency. The heat sink 42 bleeds off excess heat to keep the cells 20 operating efficiently. Those of ordinary skill in the art will appreciate that the illustrated CPV system 36 is merely one example. The present photovoltaic cells 20 may be incorporated into any CPV system, such as those including only some of the components illustrated in FIG. 4 and/or additional components not illustrated.

The above description presents modes contemplated for carrying out the present photovoltaic cells and associated methods, and of the manner and process of making and using them, in such full, clear, concise, and exact terms as to enable any person skilled in the art to which they pertain to make and use these photovoltaic cells and associated methods. These photovoltaic cells and associated methods are, however, susceptible to modifications and alternate constructions from that discussed above that are fully equivalent. Consequently, these photovoltaic cells and associated methods are not limited to the particular embodiments disclosed. On the contrary, these photovoltaic cells and associated methods cover all modifications and alternate constructions coming within the spirit and scope of the photovoltaic cells and associated methods as generally expressed by the following claims, which particularly point out and distinctly claim the subject matter of the photovoltaic cells and associated methods.

What is claimed is:

1. A photovoltaic cell, comprising:
 a semiconductor wafer that converts sunlight into electricity having a sunward surface;
 a network of gridlines on the sunward surface, the network of gridlines comprising a plurality of spaced gridlines in direct contact with the sunward surface; and
 a selectively patterned, transparent, conductive coating (TCC) in direct contact with the sunward surface, the selectively patterned TCC defining a plurality of TCC portions, TCC portions of the plurality of TCC portions being contiguous with and extending outwardly from sides of gridlines of the plurality of spaced gridlines and covering areas of the sunward surface between the gridlines of the plurality of spaced gridlines, and leaving an exposed area of the sunward surface that is uncovered by both the plurality of spaced gridlines and the plurality of TCC portions between each gridline of the plurality of spaced gridlines.

2. The photovoltaic cell of claim 1, wherein the plurality of spaced gridlines comprises a plurality of highly-conductive and optically opaque gridlines.

3. The photovoltaic cell of claim 1, wherein the TCC portions of the plurality of TCC portions each comprises a thin layer extending outwardly from a side of a gridline of the plurality of spaced gridlines.

4. The photovoltaic cell of claim 1, wherein the areas of the sunward surface of the semiconductor wafer covered by the TCC portions have a high current density relative to the exposed areas of the sunward surface.

5. The photovoltaic cell of claim 1, in combination with a concentrating photovoltaic (CPV) system including a solar collector configured to concentrate sunlight and focus the sunlight on the photovoltaic cell.

6. The photovoltaic cell of claim 1, wherein the semiconductor wafer comprises at least one of AlGaInP, AlInP, GaInP, AlGaAs, GaInAs, GaAs, and Ge.

7. A photovoltaic cell, comprising:
 a semiconductor wafer that converts sunlight into electricity having a sunward surface;
 a network of gridlines on the sunward surface, the network of gridlines comprising a plurality of spaced gridlines, each gridline of the plurality of spaced gridlines being in direct contact with the sunward surface; and
 a selectively patterned, transparent, conductive coating (TCC) in direct contact with the sunward surface, the selectively patterned TCC defining a plurality of spaced TCC portions, each TCC portion of the plurality of spaced TCC portions being contiguous with and extending outwardly from a side of a gridline of the plurality of spaced gridlines, the plurality of spaced TCC portions covering a areas of the sunward surface of the semiconductor wafer between the gridlines of the plurality of spaced gridlines and leaving an exposed area of the sunward surface of the semiconductor wafer that is uncovered by both the plurality of spaced gridlines and the plurality of spaced TCC portions between each gridline of the plurality of spaced gridlines.

8. The photovoltaic cell of claim 7, wherein the plurality of spaced gridlines comprises a plurality of highly-conductive and optically opaque gridlines.

9. The photovoltaic cell of claim 7, wherein each TCC portion of the plurality of spaced TCC portions comprises a thin layer extending outwardly from the side of the gridline of the plurality of spaced gridlines.

10. The photovoltaic cell of claim 7, wherein the areas of the sunward surface of the semiconductor wafer covered by the plurality of spaced TCC portions have a high current density relative to the exposed areas of the sunward surface.

11. The photovoltaic cell of claim 7, in combination with a concentrating photovoltaic (CPV) system including a solar collector configured to concentrate sunlight and focus the sunlight on the photovoltaic cell.

12. A method of manufacturing a photovoltaic cell configured for use in a concentrating photovoltaic (CPV) system, the method comprising:
applying a network of gridlines on a sunward surface of a semiconductor wafer that converts sunlight into electricity, the network of gridlines comprising a plurality of spaced gridlines in direct contact with the sunward surface; and
applying a selectively patterned, transparent, conductive coating (TCC) in direct contact with the sunward surface, the applied selectively patterned TCC defining a plurality of TCC portions, TCC portions of the plurality of TCC portions being contiguous with and extending outwardly from sides of gridlines of the plurality of spaced gridlines and covering areas of the sunward surface between the gridlines of the plurality of spaced gridlines, and leaving an exposed area of the sunward surface that is uncovered by both the plurality of spaced gridlines and the plurality of TCC portions between each gridline of the plurality of spaced gridlines.

13. The method of claim 12, further comprising:
combining the photovoltaic cell with a CPV system including at least one of a solar collector, a heat sink and a solar tracking apparatus.

14. The method of claim 12, wherein each TCC portion of the plurality of TCC portions is applied as a thin layer extending from the side of a gridline of the plurality of gridlines.

15. The photovoltaic cell of claim 1, wherein at least some TCC portions of the plurality of TCC portions define a T-shaped configuration with a gridline of the plurality of spaced gridlines, the gridline forming a stem of the T-shaped configuration.

16. The photovoltaic cell of claim 1, wherein a spacing between gridlines of the plurality of spaced gridlines is about 220 μm and a width of each TCC portion of the plurality of TCC portions is about 70 μm.

17. The photovoltaic cell of claim 7, wherein at least some TCC portions of the plurality of TCC portions define a T-shaped configuration with the gridline of the plurality of gridlines, the gridline forming a stem of the T-shaped configuration.

18. The method of claim 12, wherein at least some TCC portions of the plurality of TCC portions define a T-shaped configuration with a gridline of the plurality of gridlines, the gridline forming a stem of the T-shaped configuration.

* * * * *